US006261158B1

(12) United States Patent
Holland et al.

(10) Patent No.: US 6,261,158 B1
(45) Date of Patent: Jul. 17, 2001

(54) MULTI-STEP CHEMICAL MECHANICAL POLISHING

(75) Inventors: Karey Holland, Phoenix; Ajoy Zutshi, Chandler; Fen Dai, Mesa; Yehiel Gotkis, Gilbert; C. Jerry Yang; Dennis Schey, both of Mesa; Fred Mitchel, Phx.; Lin Yang, Phoenix, all of AZ (US)

(73) Assignee: SpeedFam-IPEC, Chandler, AZ (US)

( * ) Notice: Subject to any disclaimer, the term of this patent is extended or adjusted under 35 U.S.C. 154(b) by 0 days.

(21) Appl. No.: 09/212,929

(22) Filed: Dec. 16, 1998

(51) Int. Cl.[7] ................................ B24B 1/00; B24B 7/19

(52) U.S. Cl. ................................ 451/63

(58) Field of Search ................................ 451/446, 60, 57, 451/37, 444

(56) References Cited

U.S. PATENT DOCUMENTS

| | | | | |
|---|---|---|---|---|
| 4,674,236 | * | 6/1987 | Kawakami et al. | 51/325 |
| 4,910,155 | | 3/1990 | Cote et al. . | |
| 5,244,534 | | 9/1993 | Yu et al. . | |
| 5,340,370 | | 8/1994 | Cadien et al. . | |
| 5,395,801 | | 3/1995 | Doan et al. . | |
| 5,478,435 | * | 12/1995 | Murphy et al. | 156/636.1 |
| 5,516,346 | | 5/1996 | Cadien et al. | 51/308 |
| 5,522,965 | | 6/1996 | Chisholm et al. . | |
| 5,652,177 | | 7/1997 | Pan . | |
| 5,656,554 | | 8/1997 | Desai et al. . | |
| 5,658,185 | * | 8/1997 | Morgan, III et al. | 451/36 |
| 5,664,990 | * | 9/1997 | Adams et al. | 451/60 |
| 5,676,587 | | 10/1997 | Landers et al. | 451/57 |
| 5,709,593 | * | 1/1998 | Guthrie et al. | 451/287 |
| 5,733,177 | | 3/1998 | Tsuchiya et al. . | |
| 5,763,325 | | 6/1998 | Kishii et al. . | |
| 5,786,275 | | 7/1998 | Kubo . | |
| 5,853,317 | * | 12/1998 | Yamamoto | 451/288 |
| 5,916,011 | * | 6/1999 | Kim et al. | 451/41 |
| 5,934,980 | | 8/1999 | Koos et al. | 451/41 |

FOREIGN PATENT DOCUMENTS

| | | |
|---|---|---|
| 0 887 153 A2 | 12/1998 | (EP) . |
| WO 97/28925 | 8/1997 | (WO) . |
| WO 98/44061 | 10/1998 | (WO) . |

OTHER PUBLICATIONS

Bibby, T. et al., "Advantages of Orbital CMP Technology for Oxide and Metal Planarization," Clarkson University, (Aug. 1997).

Dejute, Ruth, "CMP Grows in Sophistication," *Semiconductor International*, (Nov. 1998).

* cited by examiner

*Primary Examiner*—Rodney A. Butler
(74) *Attorney, Agent, or Firm*—Merchant & Gould PC

(57) ABSTRACT

A multi-step CMP system is used to polish a wafer to form metal interconnects in a dielectric layer upon which barrier and metal layers have been formed. A first polish removes an upper portion of the metal layer using a first slurry and a first set of polishing parameters, leaving residual metal within the dielectric layer to serve as the metal interconnects. A second polish of the wafer on the same platen and polishing pad removes portions of the barrier layer using a second slurry under a second set of polishing parameters. The second polish clears the barrier layer from the upper surface of the dielectric layer, thereby forming the metal interconnect. To reduce dishing and dielectric erosion, the second slurry is selected so that the barrier layer is removed at a faster rate than the residual metal within the dielectric layer. A cleaning step may be optionally performed between the first and second polishes. Further, the first polish may include a soft landing step to further reduce dishing and dielectric erosion. Alternatively, the first polish may be used to remove portions of the metal and barrier layers, leaving residual metal in the dielectric layer to serve as the metal interconnect. A second polish using a dielectric slurry is then performed to reduce microscratches.

42 Claims, 10 Drawing Sheets

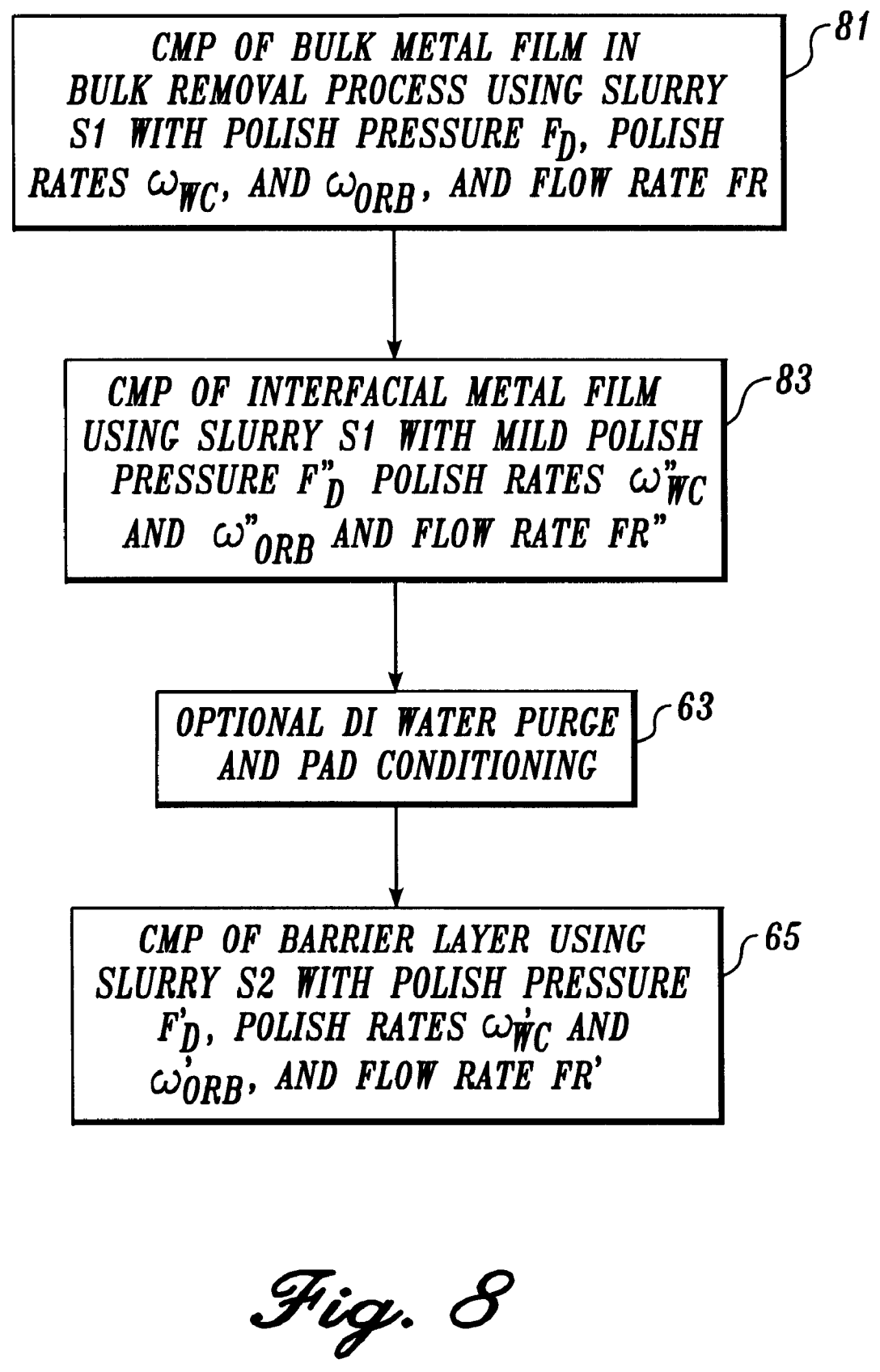

81 — CMP OF BULK METAL FILM IN BULK REMOVAL PROCESS USING SLURRY S1 WITH POLISH PRESSURE $F_D$, POLISH RATES $\omega_{WC}$, AND $\omega_{ORB}$, AND FLOW RATE FR 83 — CMP OF INTERFACIAL METAL FILM USING SLURRY S1 WITH MILD POLISH PRESSURE $F''_D$ POLISH RATES $\omega''_{WC}$ AND $\omega''_{ORB}$ AND FLOW RATE FR"

63 — OPTIONAL DI WATER PURGE AND PAD CONDITIONING

65 — CMP OF BARRIER LAYER USING SLURRY S2 WITH POLISH PRESSURE $F'_D$, POLISH RATES $\omega'_{WC}$ AND $\omega'_{ORB}$, AND FLOW RATE FR'

Fig. 8

MULTI-STEP CHEMICAL MECHANICAL POLISHING

FIELD OF THE INVENTION

The present invention relates to chemical-mechanical polishing (CMP) and, more particularly, a CMP system using two or more slurries during the CMP process.

BACKGROUND INFORMATION

CMP is often used in the fabrication of integrated circuits to planarize a surface of a wafer to facilitate subsequent photolithographic process steps or to globally remove portions of a layer formed on the wafer. In particular, CMP can be used in fabricating inter-layer interconnects (e.g., metal plugs for contacts or vias), or for forming intra-layer interconnects (e.g., copper interconnect lines in a damascene process). In addition, CMP can be used in dual damascene processes in which both inter-layer and intra-layer interconnects are formed using deposition of a single metal layer.

FIG. 1 is a diagram illustrative of a conventional CMP system 10 for polishing a wafer 11. CMP system 10 includes a wafer carrier WC1 to hold wafer 11, a platen P1 with a polishing pad 13, and a slurry dispenser 15 with slurry S1. In conventional CMP system 10, a down force is applied to wafer carrier WC1 to achieve a polish pressure of $F_{D1}$. To polish the surface of wafer 11, wafer carrier WC1 is also rotated at a rate of $\omega_{WC1}$, while platen P1 is typically rotated in the opposite direction at a rate of $\omega_{P1}$. In this example, dispenser 15 dispenses slurry S1 to the surface of polish pad 13 to facilitate the polishing process. In this example, slurry S1 is a slurry designed for metal polishing. A metal slurry (i.e., a slurry for metal polishing) is typically water-based, having abrasive particles on the order of twenty to two hundred nanometers in diameter in colloidal suspension. The slurry density is about 1% to 5% by weight, with a pH typically ranging from 3 to 11.

FIGS. 2A and 2B are diagrams illustrative of a cross-section of wafer 11 (FIG. 1) during a conventional single-step CWP process. To facilitate understanding of this description, the same reference numbers are used in several of the drawings to indicate elements having the same or similar function or structure. Referring to FIG. 2A, wafer 11 (FIG. 1) has a semiconductor substrate 21 with built in active device such as a transistor gate, upon which a dielectric layer 23, a barrier layer 25 and a metal layer 27 are formed. It will be appreciated that barrier layer 25 can also serve as an adhesion or glue layer for metal layers that do not readily adhere to dielectric layer 23. For example, metal layer 27 can be a Tungsten (W) layer, with CMP system 10 (FIG. 1) being used to remove the top portion of metal layer 27 to form W plugs in the contact holes in dielectric layer 23. Barrier layer 25 would typically be formed from Titanium (Ti), Titanium Nitride (TiN) or a Ti/TiN stack for barrier and adhesion purposes. FIG. 2B shows the resulting structure after the conventional CMP process is performed.

More specifically, referring to FIGS. 1, 2A and 2B, wafer 11 is held in wafer carrier WC1, with metal layer 27 facing polishing pad 13. Dispenser 15 dispenses metal slurry S1 onto the polishing pad 13 at a flow rate of FR1. Slurry S1 is typically chosen to more selective with respect to metal layer 27 relative to barrier layer 25 and dielectric layer 21. Platen P1 and wafer carrier WC1 are rotated at rates $\omega_{P1}$, and $\omega_{WC1}$, respectively. In addition, a down force $F_{D1}$ is applied to wafer carrier WC1 to perform this conventional metal polishing process.

In this conventional process, dielectric layer 23 is used as an polish stopping layer for the CMP process. The polishing may continue for a relatively short period after the endpoint is detected to ensure that all of barrier layer 25 is cleared from the surface of dielectric layer 23. Because of the relatively high selectivity of slurry S1 for metal layer 27, the removal rate of metal layer 27 is greater than the removal rates for barrier layer 25 and dielectric layer 23. As a result, at the end of barrier layer removal, a relatively large amount of metal recess (or dishing) occurs in the contact holes, as indicated by metal layer 27, in FIG. 2A being below the level of the surrounding dielectric region. The amount of metal recess is indicated in FIG. 2B as $\delta$ In addition, dielectric layer 23 is removed at a faster rate near the contact holes relative to the field regions. It is believed that the contact holes may cause this difference in removal rate by weakening the structural integrity of dielectric layer 23 in the region of the contact holes. This effect is referred to herein as dielectric erosion. The amount of dielectric erosion is indicated in FIG. 2B as a. It will be appreciated that in a typical CMP application, it is desirable to minimize both $\alpha$ and $\delta$ while maximizing the throughput of wafers being processed by CMP system 10.

Another problem encountered in CMP is illustrated in FIG. 3. FIG. 3 shows a portion of dielectric layer 23 having microscratches 31 formed thereon, after being polished using metal slurry S1. Typically, a slurry that is effective in removing metal and barrier layers also causes microscratching of dielectric layers. Microscratching is generally undesirable in metal polishing because in severe cases, microscratching may result in short-circuiting of metal interconnects subsequently formed on the dielectric layer.

One conventional approach to solving the above dishing problem is illustrated in FIG. 4. FIG. 4 illustrates a two-platen two-slurry CMP system 40. CMP system 40 includes CMP subsystems 41 and 42. In this example, CMP subsystem 41 is implemented with CMP system 10 (FIG. 1), and CMP subsystem 42 is essentially a duplicate of CMP subsystem 41. In particular, CMP subsystem 42 includes a wafer carrier WC2, a platen P2 with a polishing pad 43, and a slurry dispenser 45 with slurry S2. A down force is applied to wafer carrier WC2 to achieve a polish pressure of $F_{D2}$. Wafer carrier WC2 is rotated at a rate of $\omega_{WC2}$, while platen P2 is rotated in the opposite direction at a rate of $\omega_{P2}$. Dispenser 45 dispenses slurry S2 onto polishing pad 43 during this second polishing process. Subsystems 41 and 42 may be stations on a multi-station CMP machine, or separate CMP machines.

In this conventional approach, CMP subsystem 41 is used for metal polishing of wafer 11 using slurry S1, wafer carrier WC1 and platen P1, as described above for CMP system 10. Then, wafer 11 is cleaned (not shown) and transported to CMP subsystem 42 for dielectric polishing using a slurry S2. To reduce microscratching and/or dielectric erosion, slurry S2 is optimized for polishing dielectric layer 23 (i.e., sometimes referred to as “second platen buffing”). To reduce dishing, the metal layer polishing is performed using barrier layer 25 (FIG. 2A) as the metal polish endpoint. Wafer 11 is then transported to CMP subsystem 42 for barrier layer polishing using slurry S2, which is optimized for barrier layer polishing. These conventional systems use two platens because slurries S1 and S2 are typically incompatible. For example, metal slurries typically have a low pH while dielectric slurries have a high pH. Mixing these slurries on the same platen generally causes the abrasive particles in the slurries to flocculate and fall out of suspension, which undesirably reduces uniformity of the metal removal. However, the need for transporting the wafer to a second platen undesirably reduces throughput of CMP system 40.

Therefore, there is a need for a CMP system that reduces dishing, dielectric erosion and microscratching without reducing wafer uniformity and throughput.

SUMMARY

In accordance with the present invention, a multi-step CMP system is provided that uses a single platen. This multi-step CMP system is advantageously used to form metal interconnects such as contact, vias and damascene lines. In this application, the wafer has formed upon it a dielectric layer patterned to define an interconnect within or through the dielectric layer and a blanket metal layer is deposited over the dielectric layer. Typically, a barrier layer is formed between the dielectric and metal layers.

In one aspect of the present invention, the CMP system includes a platen with a polishing pad, a wafer carrier, a dispenser, and a controller. The controller is configured to cause the CMP system to perform a first polish of the wafer. The first polish removes an upper portion of the metal layer, leaving residual metal within the dielectric layer to serve as the metal interconnects. The first polish uses a metal slurry under a first set of polishing parameters.

Then the controller causes the CMP system to perform a second polish of the wafer using a second slurry under a second set of polishing parameters. In one embodiment, the second slurry is slurry optimized for barrier layer polishing. The second polish is then performed to clear the barrier layer from the upper surface of the dielectric layer, thereby forming the metal interconnect. Because a barrier slurry is used, the barrier layer is removed at a faster rate than the residual metal within the dielectric layer, thereby reducing metal recesses and dishing compared to conventional single-step systems. In addition, because the same platen is used for both polishes, the throughput is greater than the aforementioned two-platen system.

In another aspect of the present invention, a cleaning step is used between the first and second polishes to remove most (ideally all) of the first slurry on the polishing pad. The wafer is lifted from the polishing pad and de-ionized water is used to purge the polishing pad of the first slurry. In one embodiment, a pad conditioner is used to perform the cleaning step.

In yet another aspect of the present invention, the first polish is modified to include a soft landing step using the first slurry. The bulk metal removal of the first polish is substantially similar to the first polish of the embodiments described above. However, the interfacial metal is cleared from the barrier layer using different (typically milder) polishing parameters. For example, the polishing pressure is typically reduced in the soft landing step. The soft landing step tends to reduce dishing and dielectric erosion because the milder polishing parameters tend to reduce the extent to which the polishing pad resiliently extends into the interconnect openings of the dielectric layer during the polishing process. It is believed that this “extension” of the polishing pad into the interconnect openings results in polishing of the residual metal (causing metal recesses and dishing) and removes dielectric from the area surrounding the interconnect openings (causing dielectric erosion).

In still another aspect of the present invention, the first polish is modified to remove portions of the barrier layer in addition to the upper portion of the metal layer. The first polish exposes portions of the dielectric layer, leaving residual metal and barrier within the dielectric layer to serve as the metal interconnects. A cleaning step may be optionally performed after the first polish. The then controller causes the CMP system to perform a second polish of the wafer using a second slurry under a second set of polishing parameters. In one embodiment, the second slurry is a slurry optimized for dielectric layer polishing. This second polish removes an upper portion of the dielectric layer with significantly smaller microscratches in the dielectric layer compared to polishes using metal and barrier slurries as in the conventional single-step systems. In addition, because a dielectric slurry is used, the dielectric layer tends to be removed at a faster rate than the residual metal within the dielectric layer, which may help reduce the step height between the dielectric layer in the area near the interconnect openings and the residual metal. [Further, because the same platen is used for both polishes, the throughput is greater than the aforementioned two-platen system.

BRIEF DESCRIPTION OF THE DRAWINGS

The foregoing aspects and many of the attendant advantages of this invention will become more readily appreciated, when taken in conjunction with the accompanying drawings listed below.

FIG. 8 is a flow diagram illustrative of the operation of the multi-step CMP system of FIG. 5, according to another embodiment of the present invention.

DETAILED DESCRIPTION

Figure 5:
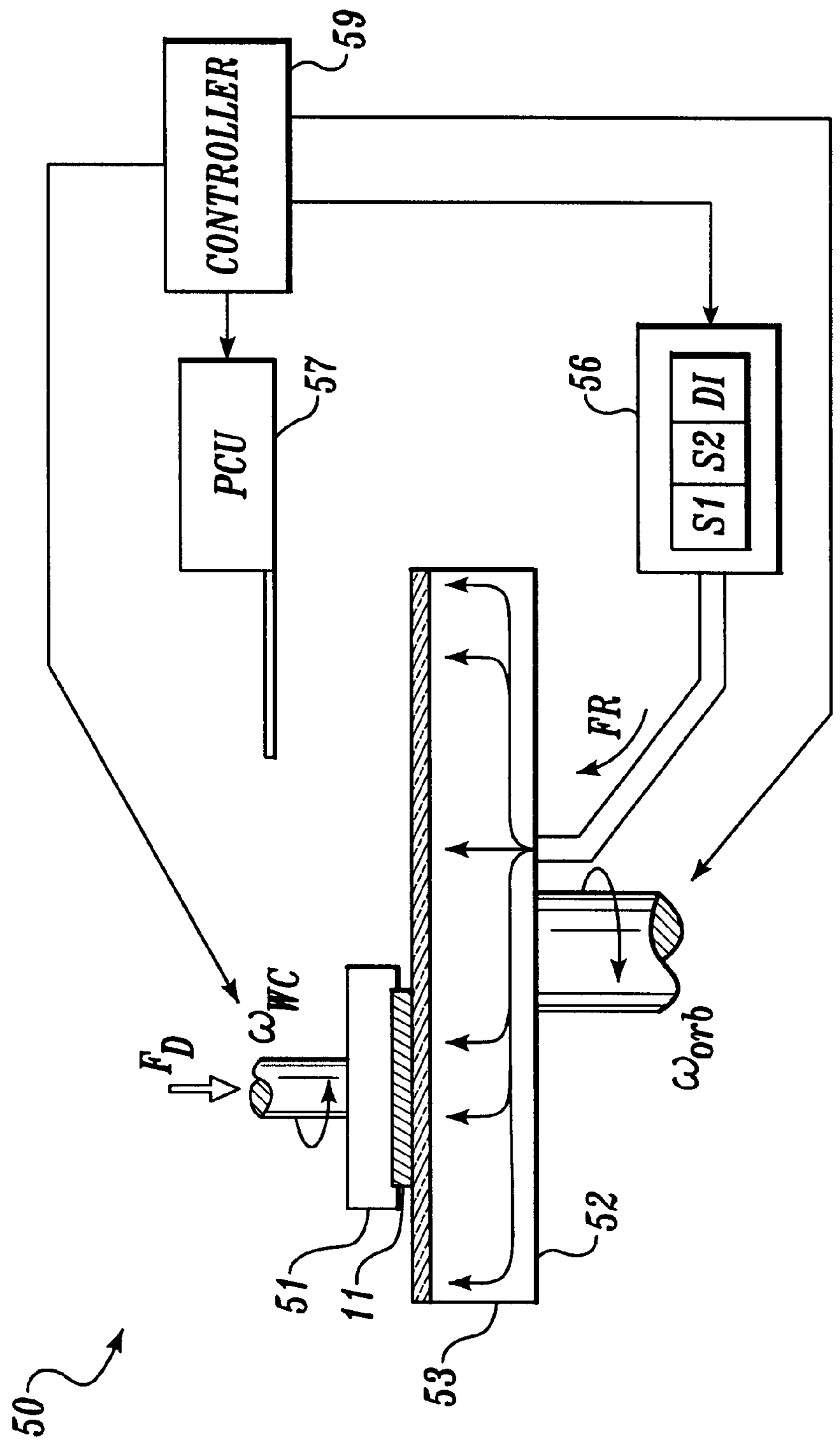
FIG. 5 is a diagram illustrative of a multi-step CMP system, according to one embodiment of the present invention.

FIG. 5 illustrates a single-platen multi-step CMP system 50, according to one embodiment of the present invention.

CMP system 50 includes a wafer carrier 51, a platen 52 with a polishing pad 53, a slurry dispenser 56, a pad-conditioning unit 57, and a controller 59. This embodiment is implemented with an orbital CMP machine such as, for example, an AvantGaard 676 CMP machine available from IPEC Planar, Phoenix, Ariz. To polish wafer 11, wafer carrier 51 holds wafer 11 while a down force is applied to achieve a polish pressure of FD. In addition, wafer carrier 51 is rotated at a rate of $\omega_{WC}$ while platen 52 is moved in an orbital path at a rate of $\omega_{ORB}$. Dispenser 56 dispenses slurry to the polishing surface of polishing pad 53 through platen 52 and holes (not shown) in polishing pad 53. In this embodiment, dispenser 56 is configured to store several different slurries &id de-ionized (DI) water.

Dispenser 56 can provide slurry S1, slurry S2 and DI water as desired during the CMP process. Pad-conditioning unit 57 cleans and conditions polishing pad 53 between wafer polishing operations. Controller 59 includes one or more microprocessors or microcontrollers (not shown) that are suitably programmed to control the operation of wafer carrier 51, platen 52, dispenser 56, and pad-conditioning unit 57. Controller 59 includes a memory (not shown) to store software or firmware programs that are executed to control the operation of CMP system 50.

Figure 6:
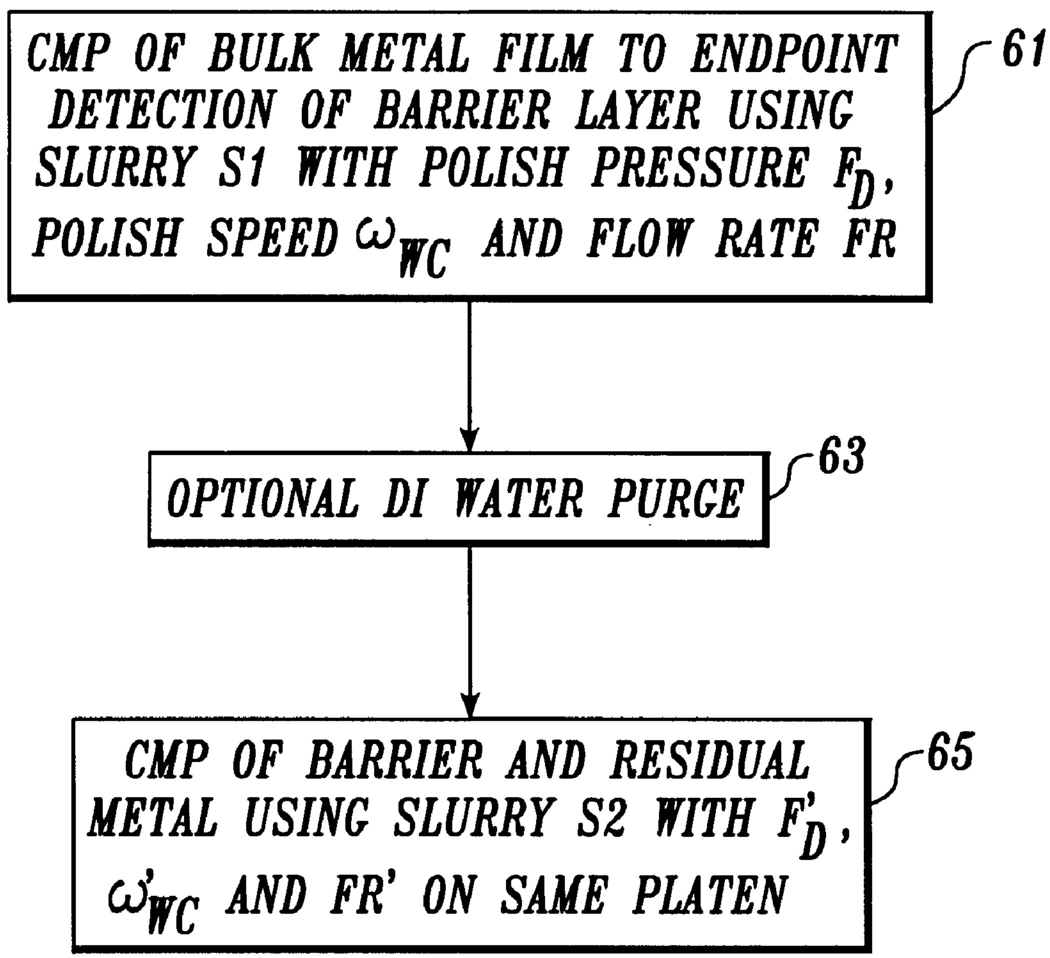
FIG. 6 is a flow diagram illustrative of the operation of the multi-step CMP system of FIG. 5, according to one embodiment of the present invention.
Figure 7A:
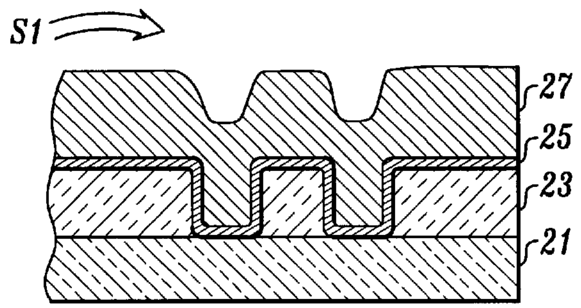
FIGS. 7A–7D are diagrams illustrative of a cross-section of a wafer during the operation of the multi-step CMP system of FIGS. 5 and 6, according to one embodiment of the present invention.

FIG. 6 illustrates the operation of CMP system 50 (FIG. 5), according to one embodiment of the present invention. FIGS. 7A–7D illustrate the resulting wafer structures at various points during the operation of CMP system 50 for this embodiment. Referring to FIGS. 5, 6, and 7A–7D, CMP system 50 operates as follows. Before CMP begins, semiconductor substrate 21 of wafer 11 has formed thereon dielectric layer 23, barrier layer 25 and metal layer 27. Dielectric layer 23 is typically an oxide layer formed by blanket deposition on substrate 21. For example, dielectric layer 23 may be silicon dioxide formed by the decomposition of tetraethylorthosilicate (TEOS). Dielectric layer 23 is then patterned and etched to form contact holes exposing selected areas of the substrate using photolithographic techniques that are standard in the integrated circuit fabrication industry. Barrier layer 25 is then deposited over dielectric layer 23 and in the contact holes to contact substrate 21. The material that barrier layer 25 is composed of generally depends on the metal of metal layer 27. For example, when metal layer 27 is made of tungsten (W), barrier layer 25 is typically formed from Ti, TiN, or a Ti/TiN stack. When metal layer 27 is formed from copper (Cu), barrier layer 25 is typically formed from Tantalum (Ta), Tantalum Nitride (TaN) or a Ta/TaN stack. The resulting structure is illustrated in FIG. 7A.

In this embodiment, CMP system 50 is used to form contacts by removing the upper portion of metal layer 27, leaving plugs in the holes (lined by barrier layer 25) in dielectric layer 23.

In a step 61, CMP system 50 is used in a standard manner to perform CMP of metal layer 27. More specifically, controller 59 causes dispenser 56 to dispense metal slurry S1 to the surface of polishing pad 53, as illustrated in FIG. 7A. In addition, controller 59 causes wafer carrier 51 to rotate at a rate of $\omega_{WC}$ and provide a polishing pressure of $F_D$. Further, controller 59 also causes platen 52 to orbit at a rate of $\omega_{ORB}$.

Slurry S1 can be any suitable metal slurry, such as Cabot 4110, available from Cabot Corporation, Boston Mass. or Baiplanar 7L or Cabot SSW-2000 for tungsten polishing, available from Baikowski International, Charlotte, N.C. Generally, slurry S1 should be water-based at a pH of about 3 to 11, with a colloidal suspension of abrasive particles having a diameter of about 20 to 200 nanometers, and a slurry density of about 1% to 5% by weight. Preferably, slurry S1 has a selectivity ratio of greater than ten-to-one of metal over barrier.

Figure 1:
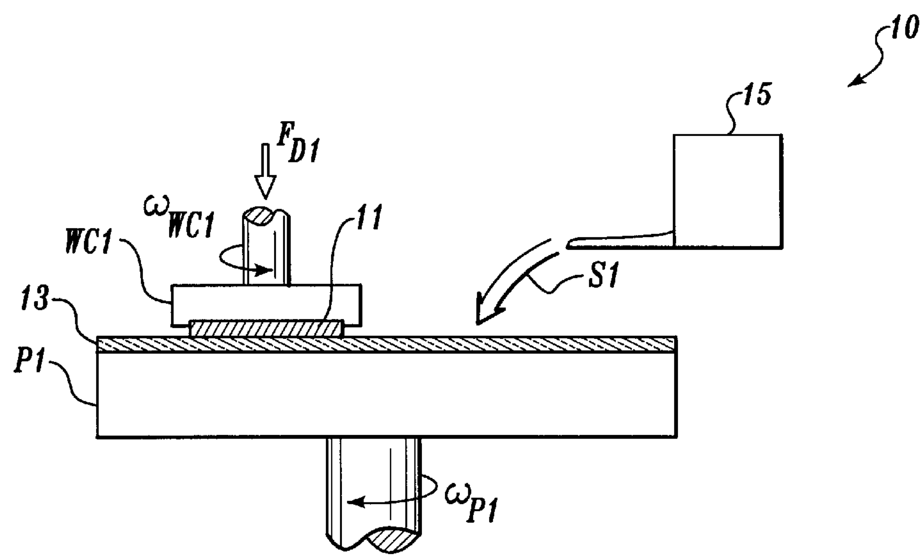
FIG. 1 is a diagram illustrative of a conventional CMP system.
Figure 2A:
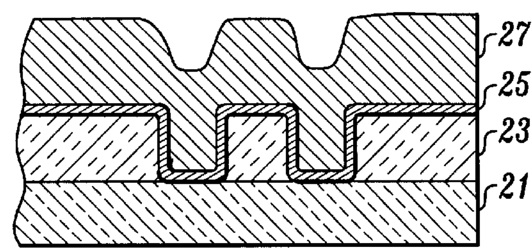
FIGS. 2A and 2B are diagrams illustrative of a cross-section of a wafer during a conventional single-step CMP process.
Figure 2B:
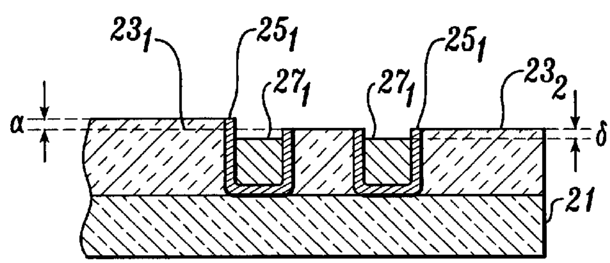
Figure 3:
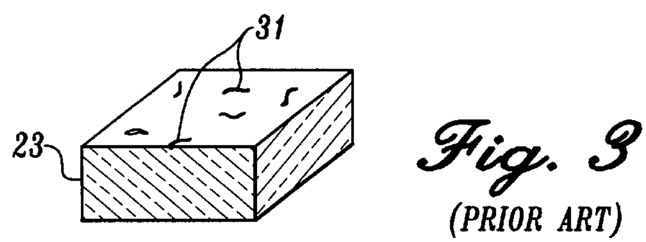
FIG. 3 is a diagram illustrative of a portion of a wafer having microscratches after undergoing a conventional CMP process.
Figure 4:
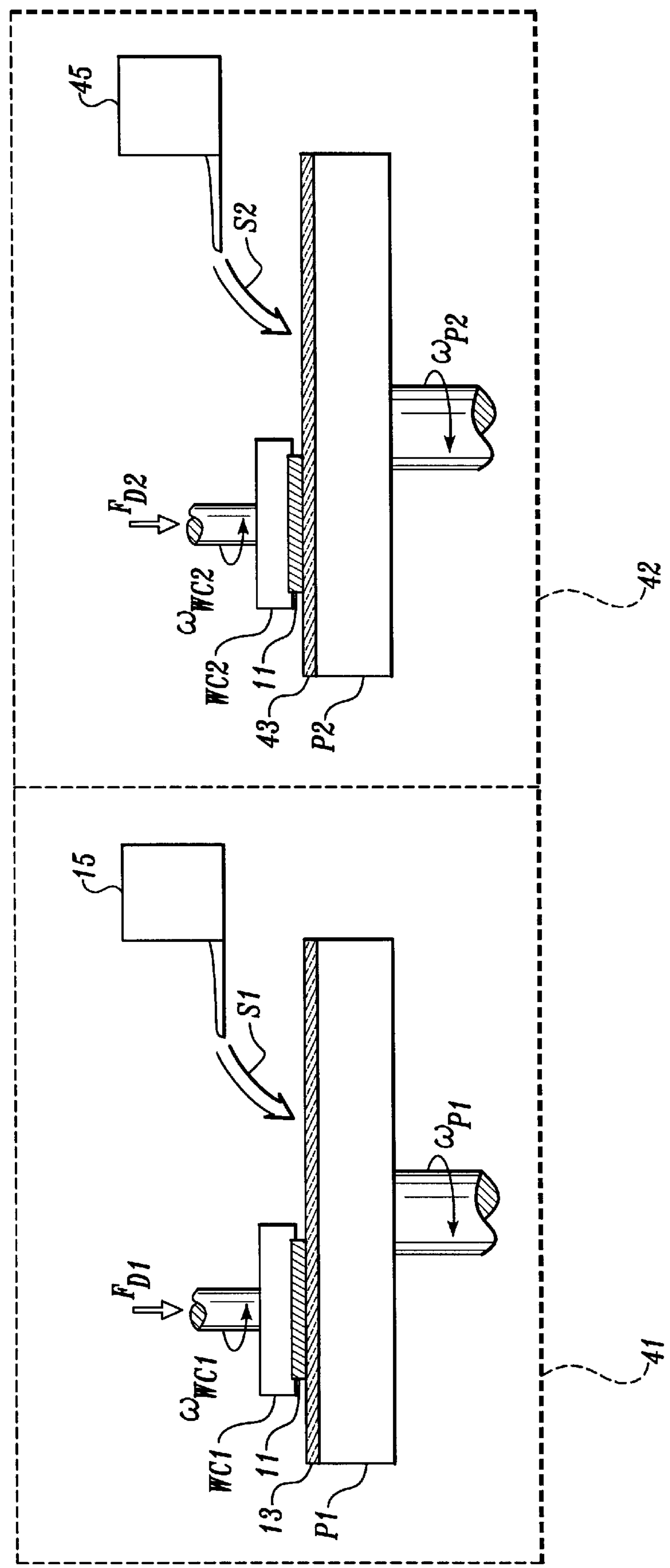
FIG. 4 is a diagram illustrative of a conventional two-platen two-slurry CMP system.
Figure 7B:
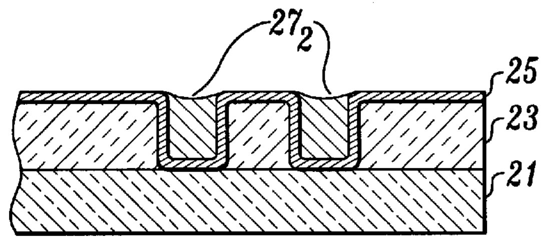

In this embodiment, this metal polishing process is continued until barrier layer 25 is exposed. For example, this step may be performed using barrier layer 25 as a polish stop in a suitable conventional endpoint detection scheme. Alternatively, timed techniques may be used. As a result of the removal of the upper portion of metal layer 27, residual portions or plugs $\mathbf{27}_2$ of metal layer 27 (FIG. 7A) remain in the barrier-lined contact holes formed in dielectric layer 23. Because the metal polishing is stopped when the barrier layer is detected, there is typically some metal recesses and dishing of plugs $\mathbf{27}_2$, but the amount of metal recesses is less than in the conventional approach described above in conjunction with FIGS. 1, 2A and 2B. The resulting structure is illustrated in FIG. 7B.

Figure 7C:
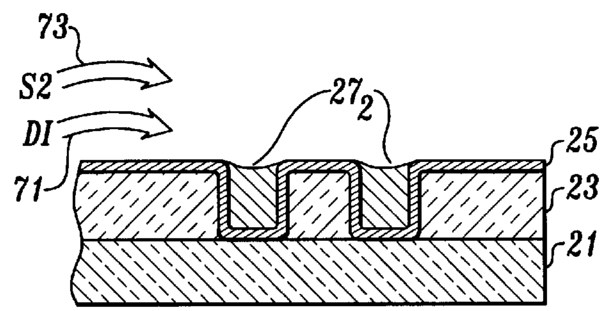

In a step 63, controller 59 causes wafer carrier 51 to be lifted from polishing pad 52 and platen 52. Controller 59 then causes a DI water purge of the polishing pad 53 to reduce the amount of slurry S1 on polishing pad. In particular, controller 59 causes dispenser 56 to dispense DI water while also causing pad-conditioning unit 57 to clean polishing pad 53. This step is optional, depending on how compatible slurry S2 is with slurry S1. For example, step 63 is advantageously used when slurry S1 is a low pH slurry and slurry S2 is a high pH slurry. The DI water purge significantly reduces the amount of residual slurry S1 on polishing pad 53, thereby significantly reducing undesirable flocculation. This step is illustrated in FIG. 7C by an arrow 71 indicating flow of DI water onto the surface of wafer 11. In contrast, slurry S2 may be equivalent to a reduced concentration of slurry S1, or slurry S2 may have the same pH as slurry S1. For example, slurry S2 may be formulated at the same pH as the slurry S1 but with abrasives of a smaller size and softer abrasive characteristic. In these cases, step 63 may be omitted because the similar nature of the slurries will not likely result in flocculation.

Figure 7D:
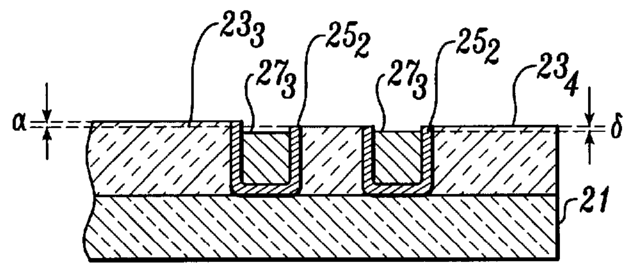

In a step 65, controller 59 causes wafer carrier 51 to bring wafer 11 into contact with polishing pad 53 with a second polishing pressure $F_D'$ while rotating at a second rate of $\omega_{WC}'$. In addition, controller 59 causes platen 52 to orbit at a second rate $\omega_{ORB}'$ and dispenser 57 to dispense slurry S2 onto the surface of wafer 11 (as indicated by an arrow 73 in FIG. 7C). This second polishing step is continued until the surface of dielectric layer 23 is exposed, as illustrated in FIG. 7D. During this polishing step, plugs $\mathbf{27}_2$ (FIG. 7C) also get polished, thereby resulting in the removal of relatively small amounts of metal to form plugs $\mathbf{27}_3$ shown in FIG. 7D.

In one embodiment, slurry S2 is optimized for removal of barrier layer 25. Preferably, slurry S2 has a selectivity ratio of about one-to-one or less of metal over barrier. Any suitable barrier slurry may be used such as, for example, Cabot 4200 from Cabot Corporation when barrier layer 25 is formed from Ta, TaN or a Ta/TaN stack. Alternatively, slurry S2 may be Baiplanar 41 with pH less than four by Baikowski International when barrier layer 25 is formed from Ti, TiN or a Ti/TiN stack. Yes Because the selectivity of slurry S2 for metal over barrier is reduced in the second polishing step, the value of $\delta$ (i.e., metal recesses or dishing) is advantageously reduced. In addition, the value of $\alpha$ (i.e., dielectric erosion) also can be reduced when slurry S2 is chosen to have a selectivity for barrier over dielectric that is higher than for slurry S1. That is, the difference in thickness of dielectric portion $23_3$ and dielectric portion $23_4$ is smaller than it would be if a conventional single-step process were used. In addition, because a single platen is used, the throughput of CMP system 50 is significantly higher than the aforementioned conventional two-platen systems.

Table 1 summarizes values for the polishing parameters for the various steps of this process according to one embodiment.

TABLE 1

| | First Polish | Purge | Second Polish |
|---|---|---|---|
| $F_D$ | 2–6 psi | 0 | 2–6 psi |
| $\omega_{WC}$ | 12–36 rpm | n/a | 12–36 rpm |
| $\omega_{ORB}$ | 200–600 rpm | N/a | 200–600 rpm |
| FR | 50–150 ml/min | 100–400 ml/min | 50–150 ml/min |
| time | to barrier endpoint | 10 sec. | To dielectric endpoint |
| Slurry | Cabot SSW-2000 | DI water | Cabot SSW-2000 (50%) |

Although CMP system 50 is described in conjunction with contact fabrication, in light of the present description, those skilled in the art of integrated circuit abrication will appreciate that this embodiment of CMP system 50 can also be used to fabricate vias or to fabricate intra-layer interconnects using damascene techniques. Damascene techniques are used in some Cu interconnect fabrication technologies.

FIG. 8 illustrates the operation of CMP system 50 (FIG. 5), according to another embodiment of the present invention. FIGS. 9A–9E illustrate the resulting wafer structures at various points during this embodiment of the operation of CMP system 50. This embodiment is substantially the same as the embodiment described above in conjunction with FIGS. 5, 6 and 7A–7D, except that step 61 (FIG. 6) is split into two steps to achieve a "soft landing." The term soft landing is used herein to refer to changing the polishing parameters near the endpoint to reduce the removal rate(s), which tends to reduce dishing and/or dielectric erosion.

Figure 9A:
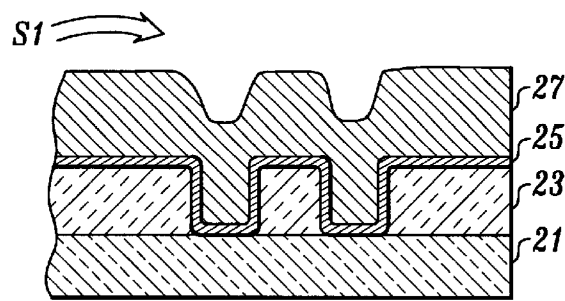
FIGS. 9A–9E are diagrams illustrative of a cross-section of a wafer during the operation of the multi-step CMP system of FIGS. 5 and 8, according to one embodiment of the present invention.

Referring to FIGS. 5, 8 and 9A–9E, CMP system 50 operates in this embodiment as follows. In a step 81, CMP system 50 is used in a standard manner to perform CMP of metal layer 27. More specifically, controller 59 causes dispenser 56 to dispense metal slurry S1 to the surface of polishing pad 53. This is illustrated in FIG. 9A. Slurry S1 is a suitable metal slurry for polishing metal layer 27. Preferably, slurry S1 has a selectivity ratio of greater than ten-to-one of metal over barrier. In addition, controller 59 causes wafer carrier 51 to rotate at a rate of $\omega_{WC}$ and provide a polishing pressure of $F_D$. Further, controller 59 also causes platen 52 to orbit at a rate of $\omega_{ORB}$.

Figure 9B:
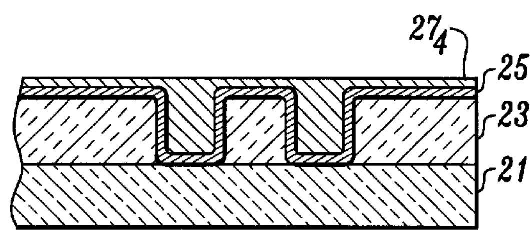

In this embodiment, this metal polishing process is stopped slightly before barrier layer 25 is exposed. For example, this step may be performed using timed polishing techniques. As illustrated in FIG. 9B, a relatively thin metal layer $27_4$ remains above barrier layer 25. Because the polishing is used to remove the bulk of metal layer 27 (FIG. 9A) without polishing barrier layer 25, step 81 may be optimized for a high removal rate.

Figure 9C:
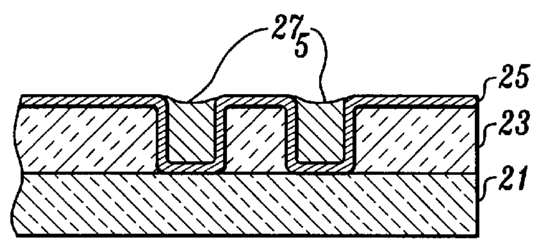
Figure 9D:
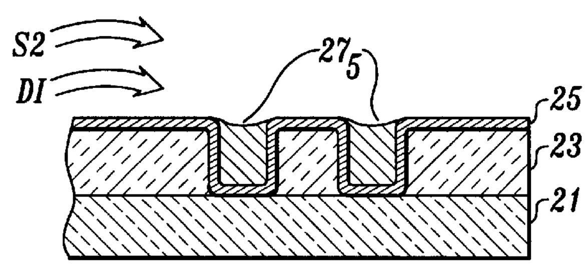
Figure 9E:
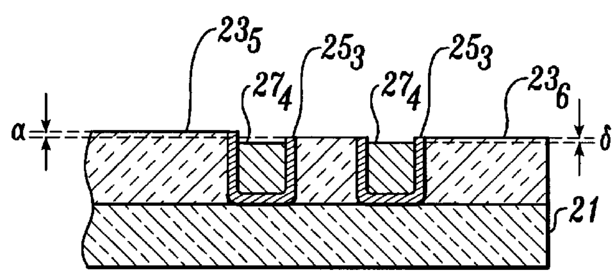

In a step 83, controller 59 changes the polishing parameters to achieve a soft landing. In particular, controller 59 causes dispenser 56 to continue to dispense slurry S1. In addition, wafer carrier 51 need not be lifted to remove wafer 11 from polishing pad 53. However, the polishing pressure $F_D$, the slurry flow rate FR, the polishing rate $\omega_{WC}$, and the orbit rate $\omega_{ORB}$ may be reduced. In this embodiment, step 83 is performed until barrier layer 25 is detected, resulting in the formation of metal plugs $27_5$ in the barrier-lined contact holes formed in dielectric layer 21 as illustrated in FIG. 9C. The soft landing tends to reduce the dishing of metal plugs $27_5$. Steps 63 and 65 are then performed as described above.

Table 2 summarizes values for the polishing parameters for the various steps of this process according to one embodiment.

TABLE 2

| | First Polish | Soft Landing | Purge | Second Polish |
|---|---|---|---|---|
| $F_D$ | 3–6 psi | 1–3 psi | 0 | 2–6 psi |
| $\omega_{WC}$ | 18–36 rpm | 12–24 rpm | n/a | 18–36 rpm |
| $\omega_{ORB}$ | 300–600 rpm | 200–400 rpm | n/a | 300–600 rpm |
| FR | 50–150 ml/min | 50–150 ml/min | 100–400 ml/min | 50–150 ml/min |
| time | Timed | Barrier endpoint | 10 sec. | Dielectric endpoint |
| slurry | Cabot 4110 | Cabot 4110 | DI water | Cabot 4200 |

Figure 10:
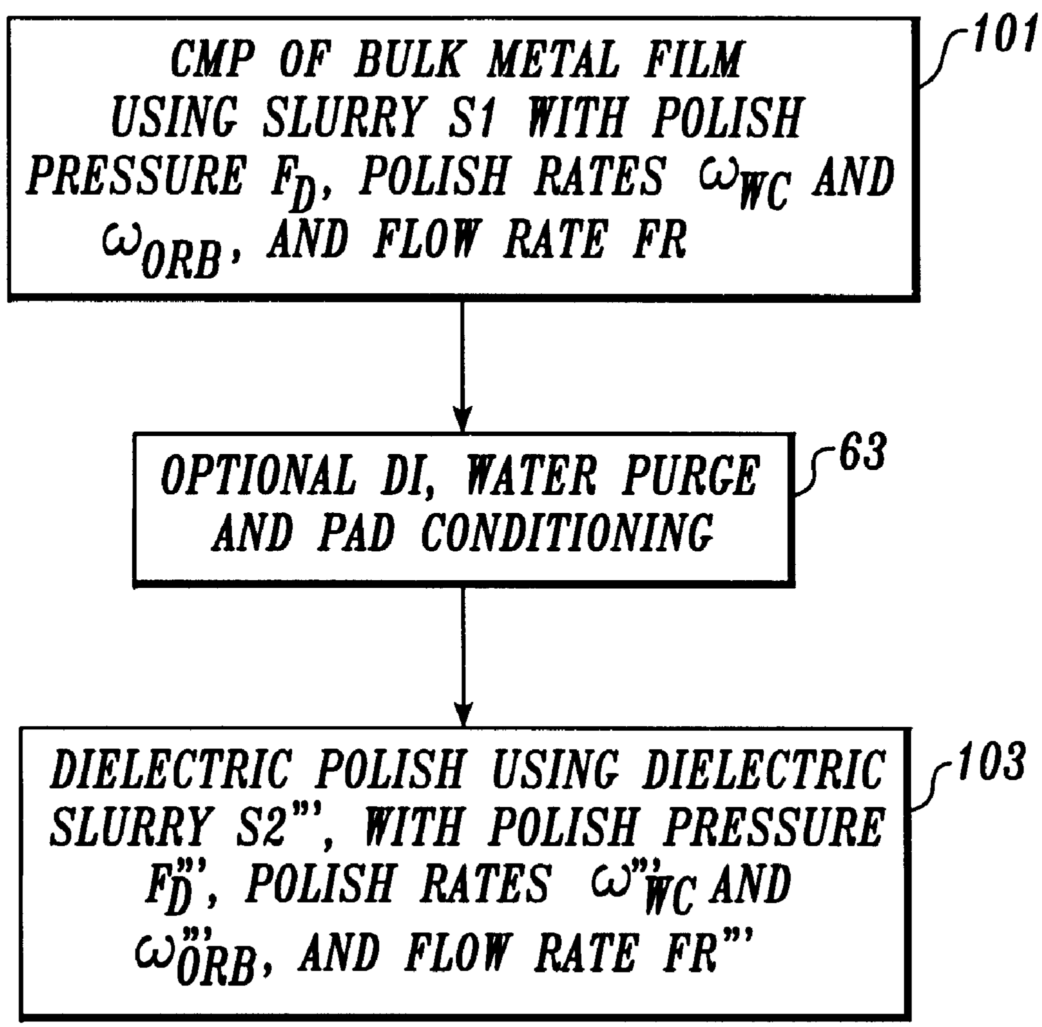
FIG. 10 is a flow diagram illustrative of the operation of the multi-step CMP system of FIG. 5, according to still another embodiment of the present invention.

FIG. 10 illustrates the operation of CMP system 50 (FIG. 5), according to another embodiment of the present invention. FIGS. 11A–11D illustrate the resulting wafer structures at various points during this embodiment of the operation of CMP system 50.

Figure 11A:
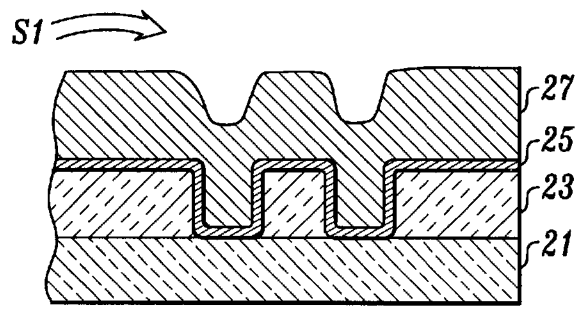
FIGS. 11A–11D are diagrams illustrative of a cross-section of a wafer during the operation of the multi-step CMP system of FIGS. 5 and 10, according to one embodiment of the present invention.

In a step 101, CMP system 50 is used in a standard manner to perform CMP of metal layer 27. More specifically, controller 59 causes dispenser 56 to dispense metal slurry S1 to the surface of polishing pad 53, as illustrated in FIG. 11A. Preferably, slurry S1 has a selectivity ratio of greater than ten-to-one of metal over barrier. In addition, controller 59 causes wafer carrier 51 to rotate at a rate of $\omega_{WC}$ and provide a polishing pressure of $F_D$. Further, controller 59 also causes platen 52 to orbit at a rate of $\omega_{ORB}$.

Figure 11B:
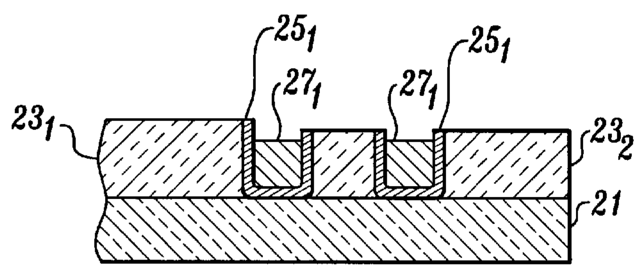
Figure 11C:
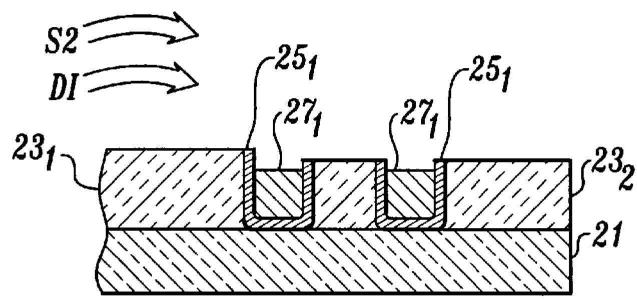

In this embodiment, this metal polishing process is continued until dielectric layer 23 is exposed, as illustrated in FIG. 11B. For example, step 101 may be performed using dielectric layer 23 as a polish stop in a suitable conventional endpoint detection scheme. An overpolish may be performed to clear any residual barrier layer material from dielectric layer 23. As a result of the removal of the upper portions of barrier layer 25 and metal layer 27, residual portions or plugs $27_1$ (FIG. 11B) remain in the barrier-lined contact holes formed in dielectric layer 23. Because the metal polishing is not stopped until the dielectric layer is cleared, there is typically significant dishing of plugs $27_1$. The amount of dishing is comparable to the dishing of the conventional approach described above in conjunction with FIGS. 1, 2A and 2B.

Figure 11D:
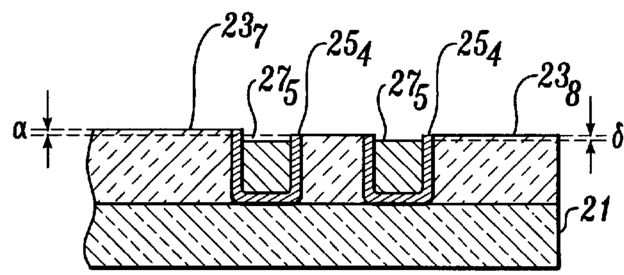

Then step 63 is performed in which wafer carrier 51 is lifted and a DI water purge is performed, as described above in conjunction with FIG. 6. A next step 103 is then performed. In step 103, controller 59 causes platen 52 to orbit at a different rate $\omega_{ORB}'''$ and dispenser 57 to dispense slurry S2 onto the surface of polishing pad 53. In this embodiment, slurry S2 is a dielectric slurry rather than a barrier slurry as in the previously-described embodiments. In addition, controller 59 causes wafer carrier 51 to bring wafer 11 into contact with polishing pad 53 with a different polishing pressure $F_D'''$ while rotating at a different rate of $\omega_{WC}'''$. This second polishing step removes a portion of dielectric layer 23 to reduce dishing and microscratches. More specifically, dielectric layer 23 is polished so the surfaces of the resulting dielectric layer (portion $23_7$ in the field region and portion $23_8$ in the contact region) are about level with the surface, as illustrated in FIG. 11D. During this polishing step, plugs $27_1$, (FIG. 11C) also get polished, thereby resulting in the removal of relatively small amounts of metal to form plugs $27_5$ shown in FIG. 11D.

In one embodiment, slurry S2 is optimized for polishing of dielectric layer 23. Preferably, slurry S2 has a selectivity ratio of about ten-to-one or more of dielectric over metal. Any suitable dielectric slurry may be used such as, for example, Cabot type SS12 from Cabot Corporation or Klebosol 30H50 low pH $SiO_2$ available from Rodel. Alternatively, slurry S2 may be Baiplanar 41 with pH less than four by Baikowski International. This type of slurry has a pH comparable to the pH of slurry S1, which allows step 63 to be skipped. Because the selectivity of slurry S2 for dielectric over metal is much increased in this second polishing step, the value of δ (i.e., dishing) is advantageously reduced. In addition, microscratches are also reduced. As in the other embodiments, because a single platen is used, the throughput of CMP system 50 is significantly higher than the aforementioned conventional two-platen systems.

Table 3 summarizes values for the polishing parameters for the various steps of this process according to one embodiment.

TABLE 3

| | First Polish | Purge | Second Polish |
|---|---|---|---|
| $F_D$ | 3–6 psi | 0 | 2–4 psi |
| $\omega_{WC}$ | 12–24 rpm | N/a | 12–24 rpm |
| $\omega_{ORB}$ | 200–400 rpm | N/a | 200–400 rpm |
| FR | 50–150 ml/min | 100–400 ml/min | 50–200 ml/min |
| time | Dielectric endpoint | 10 sec. | 20–200 sec. |
| slurry | Baiplanar 7L | DI water | Rodel Klebosol 30H50 |

In an alternative embodiment, step 101 may be split into two steps using the same slurry S1 in a soft landing approach. This approach is substantially similar to replacing step 101 with steps 81 and 83 (FIG. 8).

Figure 12:
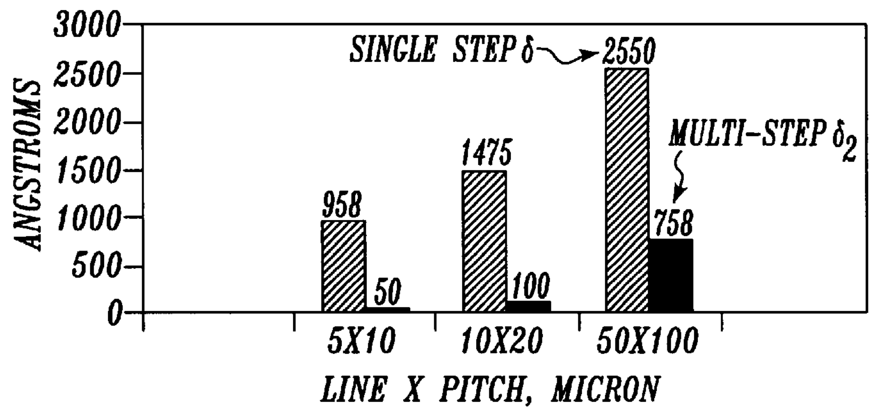
FIG. 12 is a diagram illustrative of a comparison of dishing achieved by using a multi-step CMP system according to one embodiment of the present invention and a conventional single-step CMP system.
Figure 13:
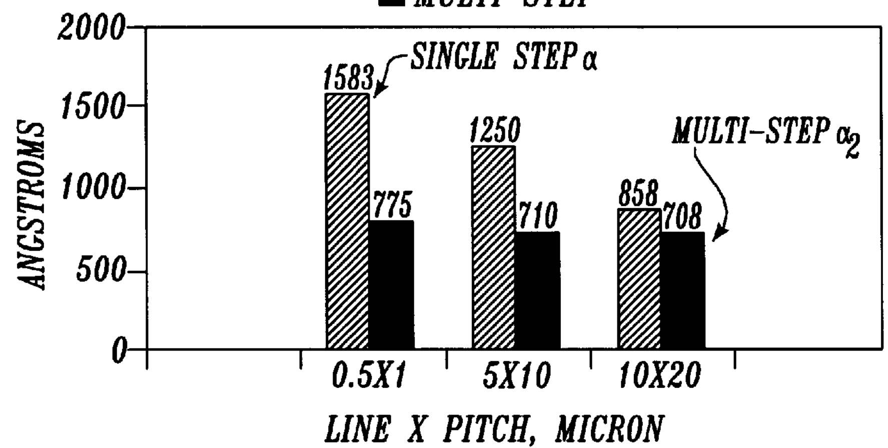
FIG. 13 is a diagram illustrative of a comparison of dielectric erosion achieved by using a multi-step CMP system according to one embodiment of the present invention and a conventional single-step CMP system.

FIGS. 12 and 13 respectively illustrate the amount of dishing and dielectric erosion resulting from the use of CMP system 50 (FIG. 5) and the soft landing technique (FIG. 8) in a Cu damascene application. In this example, TEOS oxide layer of about 5000 Å was deposited on several wafers, and several variously sized trenches were formed therein. A conformal TaN barrier layer and then a blanket Cu layer were then deposited on the oxide layer of each wafer. The barrier and metal layers were about 350 Å and 1.8 μm thick, respectively. In particular, this example conforms to the Sematech 926 TaN patterns for dishing and dielectric erosion for a Cu damascene process. Several of the wafers were then polished using CMP system 50 (FIG. 5) and the soft landing system (FIG. 6). Cabot 4110 slurry was used in the first polish and Cabot 4200 slurry was used in the second polish under the polishing parameters summarized in Table 2 above.

For comparison, other wafers were polished using the aforementioned conventional single-step technique. An IPEC 676 polisher was used to implement CMP system 50 (FIG. 5). As shown in FIGS. 12 and 13, significant improvement in dishing and dielectric erosion. For example, for 5×10 micron trenches, CMP system 50 reduced dishing to about 50 Å and dielectric erosion to about 710 Å, compared to about 958 Å and 1250 Å, respectively for the conventional single-step system. No significant differences in microscratching were observed.

In another example, W contacts were formed using CMP system 50 and the process described above in conjunction with FIGS. 5 and 6. In this example, a TEOS oxide layer was deposited on several wafers and 0.5 μm contact holes were formed therein. Then a barrier layer of 800 Å TiN and 200 Å Ti was deposited over the oxide layer. Finally, a metal layer of 800 Å W was deposited on the barrier layer. An IPEC 676 polisher was used to implement CMP system 50 (FIG. 5) and the two-step single-platen process (FIG. 6).

Cabot SSW-2000 slurry was used in the first polish step. Without the DI water purge, a modified Cabot SSW-2000 slurry was used in the second polish step. More specifically, standard Cabot SSW-2000 was diluted to have less solid content than the standard slurry (i.e., 50% solid concentration relative to the standard concentration) under the polishing parameters summarized in Table 1 above. This embodiment achieved a reduction of about 50% in dielectric erosion compared to the conventional single-step system; e.g., about 100 Å average compared to 2000 Å average for the conventional single-step process. However, only a slight reduction in dishing was observed; e.g., about 245 Å average compared to about 250 Å average for the conventional single-step process. It is believed that dishing was not significantly reduced because the slurries in the first and second polishing steps have about the same selectivity of metal over barrier. No significant differences in microscratching were observed.

In still another example, W contacts were formed using CMw system 50 and the process described above in conjunction with FIGS. 5 and 10. In this example, a TEOS oxide layer was deposited on several wafers and 0.5 μm contact holes were formed therein. Then a barrier layer of 800 Å TiN and 200 Å Ti was deposited over the oxide layer. Finally, a metal layer of 800 Å W was deposited on the barrier layer. An IPEC 676 polisher was used to implement CMP system 50 (FIG. 5) and the two-step single-platen process (FIG. 8).

Baiplanar 7L slurry was used in the first polish step to expose the TEOS oxide layer. The DI water purge step was performed before the second polish. In the second polish, Rodel Kiebosol 30H50 low pH $SiO_2$ slurry was used under the polishing parameters listed in Table 3 above. This embodiment achieved slight reductions in dishing and dielectric erosion compared to the conventional single-step system; e.g., about 2% reduction in dishing and about 10% reduction in dielectric erosion compared to the conventional single-step process. However, a 50% reduction in microscratches was observed; e.g., about 150 Å root mean square (rms) compared to about 300 Å rms for the conventional single-step process. It is believed that dishing was not significantly reduced because the polish time of the second polish step was relatively short in this example, i.e. thirty seconds.

The embodiments of the multi-step CMP system described above are illustrative of the principles of the present invention and are not intended to limit the invention to the particular embodiments described. For example, in light of the present disclosure, those skilled in the art can devise without undue experimentation embodiments using slurries or CMP tools other than those described. In particular, rotating CMP tools may be used rather the orbital CMP described. Further, other embodiments may employ three or more polishing steps on a single platen to achieve desired optimization of throughput, dishing and dielectric erosion. Still further, those skilled in the art can implement other embodiments for interconnects structures that do not have a barrier layer. Additionally, the terms "wafer" or "semiconductor wafer" have been used extensively herein; however, they may be more generally referred to by the term "workpiece" which is intended to include the following: semiconductor wafers, both bare or other semiconductor substrates such as those with or without active devices or circuitry, and partially processed wafers, as well as silicon on insulator, hybrid assemblies, flat panel displays, Micro-Electro-Mechanical Sensors (MEAMS), MEMS wafers, hard computer disks or other such materials that would benefit from planarization. Accordingly, while the preferred embodiment of the invention has been illustrated and described, it will be appreciated that various changes can be made therein without departing from the spirit and scope of the invention.

We claim:

1. A method of performing chemical-mechanical polishing (CMP) of a wafer using a CMP machine, the CMP being performed on the wafer in fabricating metal interconnects of an integrated circuit, the wafer having formed thereon a dielectric layer patterned to define an interconnect, a barrier layer formed over the dielectric layer and a metal layer formed over the barrier layer, the CMP machine having a platen with a polishing pad mounted thereon, a slurry dispenser and a wafer carrier, the method comprising:

disposing the wafer in operative position to the polishing pad of the CMP machine using the wafer carrier;

performing a first polish of the wafer with a first slurry using the CMP machine configured with a first set of polishing parameters, wherein the first polish exposes the barrier layer or the dielectric layer beneath the metal layer; and performing a second polish of the wafer with a second slurry using the CMP machine configured with a second set of polishing parameters, wherein the second polish is performed using the polishing pad and the platen that were used in the first polish, and wherein the second slurry is different from the first slurry.

2. The method of claim 1 wherein the metal layer is formed from copper and the interconnect defined in the dielectric layer forms part of an intra-layer interconnect.

3. The method of claim 1 wherein the metal layer is formed from tungsten and the interconnect defined in the dielectric layer forms part of an inter-layer interconnect.

4. The method of claim 1 further comprising performing a cleaning process of the polishing pad so that the performance of the second slurry is not significantly affected during the second polish.

5. The method of claim 1 wherein the first polish removes portions of the metal layer to expose portions of the barrier layer and leave residual portions of the metal layer to serve as part of the interconnect defined in the dielectric layer.

6. The method of claim 4 wherein the polishing pad is purged with de-ionized water during the cleaning process to remove the first slurry from the polishing pad.

7. The method of claim 6 wherein the polishing pad is conditioned during the cleaning process.

8. The method of claim 5 wherein the second polish is performed to remove the exposed portions of the barrier layer that do not form a part of the interconnect defined in the dielectric layer.

9. The method of claim 5 wherein the second slurry is more selective for the barrier layer over the metal layer in comparison to the first slurry.

10. The method of claim 5 wherein the second slurry is equivalent to the first slurry with a reduced solid concentration.

11. The method of claim 5 wherein the second slurry has the same pH as the first slurry.

12. The method of claim 5 wherein the first and second slurries contain abrasive particles, the abrasive particles of the second slurry having an average diameter that is smaller than that of the abrasive particles of the first slurry.

13. The method of claim 5 wherein the first and second slurries contain abrasive particles, the abrasive particle of the second slurry being softer in average than that of the abrasive particles of the first slurry.

14. An apparatus for performing chemical-mechanical polishing (CMP) of a wafer in fabricating metal interconnects of an integrated circuit, the wafer having formed thereon a dielectric layer patterned to define an interconnect, a barrier layer formed over the dielectric layer and a metal layer formed over the barrier layer, the apparatus comprising:

first polishing means for performing a first polish of the wafer with a first slurry and a first set of polishing parameters, said first polishing means using a platen and a polishing pad mounted thereon to perform the first polish, wherein the first polish exposes the barrier layer or the dielectric layer beneath the metal layer; and second polishing means for performing a second polish of the wafer with a second slurry and a second set of polishing parameters, wherein the second polish is performed using the platen and polishing pad that were used in performing the first polish, and wherein the second slurry is different from the first slurry.

15. The apparatus of claim 14 wherein the metal layer is formed from copper and the interconnect defined in the dielectric layer forms part of an intra-layer interconnect.

16. The apparatus of claim 14 wherein the metal layer is formed from tungsten and the interconnect defined in the dielectric layer forms part of an inter-layer interconnect.

17. The apparatus of claim 14 further comprising cleaning means for performing a cleaning process of the polishing pad so that the performance of the second slurry is not significantly affected during the second polish.

18. The apparatus of claim 14 wherein the first polishing means removes portions of the metal layer to expose portions of the barrier layer and leave residual portions of the metal layer to serve as part of the interconnect defined in the dielectric layer.

19. The apparatus of claim 17 wherein the cleaning means purges the polishing pad with de-ionized water to remove the first slurry from the polishing pad.

20. The apparatus of claim 19 wherein the cleaning means is configured to condition the polishing pad.

21. The apparatus of claim 18 wherein the second polishing means removes the exposed portions of the barrier layer that do not form a part of the interconnect defined in the dielectric layer.

22. The apparatus of claim 18 wherein the second slurry is has a selectivity for the barrier layer over the metal layer that is higher than that of the first slurry.

23. The apparatus of claim 18 wherein the second slurry is equivalent to the first slurry with a reduced solid concentration.

24. The apparatus of claim 18 wherein the second slurry has the same pH as the first slurry.

25. The apparatus d of claim 18 wherein the first and second slurries contain abrasive particles, the abrasive particles of the second slurry having an average diameter that is smaller than that of the abrasive particles of the first slurry.

26. The apparatus of claim 18 wherein the first and second slurries contain abrasive particles, the abrasive particle of the second slurry being softer in average than that of the abrasive particles of the first slurry.

27. A chemical-mechanical polishing (CMP) machine for polishing a wafer, the wafer having formed thereon a dielectric layer patterned to define an interconnect, a barrier layer formed over the dielectric layer and a metal layer formed over the barrier layer, the CMP machine comprising:

a platen having a polishing pad mounted thereon;

a dispenser operatively coupled to the polishing pad, the dispenser being configured to store a plurality of slurries and selectively dispense one or more of the stored slurries to the polishing pad;

a wafer carrier configured to selectively hold the wafer; and a controller coupled to the platen, dispenser and wafer carrier, the controller being configured to cause the CMP machine to perform a first polish and a second polish of the wafer, wherein:

in the first polish, the controller causes the wafer carrier and platen to impart a polishing motion between the wafer and the polishing pad according to a first set of polishing parameters, and also causes the dispenser to dispense a first slurry to an interface between the wafer and the polishing pad, the first polish exposing the barrier layer or the dielectric layer beneath the metal layer; and in the second polish, the controller causes the wafer carrier to impart a polishing motion between the wafer and the polishing pad according to a second set of polishing parameters, and also causes the dispenser to dispense a second slurry to the interface between the wafer and the polishing pad, the second slurry being different from the first slurry.

28. The CMP machine of claim 27 wherein the CMP machine is an orbital CMP machine.

29. The CMP machine of claim 27 wherein the metal layer is formed from copper and the interconnect defined in the dielectric layer forms part of an intra-layer interconnect.

30. The CMP machine of claim 27 wherein the metal layer is formed from tungsten and the interconnect defined in the dielectric layer forms part of an inter-layer interconnect.

31. The CMP machine of claim 27 further comprising a pad conditioner configured to performing a cleaning process of the polishing pad to remove first slurry from the polishing pad.

32. The CMP machine of claim 31 wherein controller is configured to cause the pad conditioner to purge the polishing pad with de-ionized water during the cleaning process to remove first slurry from the polishing pad.

33. The CMP machine of claim 27 wherein the first polish removes portions of the metal layer to expose portions of the barrier layer and leave residual portions of the metal layer to serve as part of the interconnect defined in the dielectric layer.

34. The CMP machine of claim 33 wherein the second polish removes the exposed portions of the barrier layer that do not form a part of the interconnect defined in the dielectric layer.

35. The CMP machine of claim 33 wherein the second slurry is more selective for the barrier layer over the metal layer in comparison to the first slurry.

36. The CAD machine of claim 33 wherein the second slurry is equivalent to the first slurry with a reduced solid concentration.

37. The CMP machine of claim 33 wherein the second slurry has the same pH as the first slurry.

38. The CMP machine of claim 33 wherein the first and second slurries contain abrasive particles, the abrasive particles of the second slurry having an average diameter that is smaller than that of the abrasive particles of the first slurry.

39. The CMP machine of claim 33 wherein the first and second slurries contain abrasive particles, the abrasive particle of the second slurry being softer in average than that of the abrasive particles of the first slurry.

40. A method of forming an interconnect on a workpiece, the workpiece having formed thereon a dielectric layer patterned to define the interconnect, a barrier layer formed over the dielectric layer and conductive layer formed over the barrier layer, the method comprising:

polishing the workpiece to expose the barrier layer or the dielectric layer beneath the conductive layer using a first slurry, a first set of polishing parameters, and a polishing pad;

purging the polishing pad;

conditioning the polishing pad; and polishing the workpiece to have a substantially planar polished surface using a second slurry, a second set of polishing parameters and the polishing pad, wherein the first slurry is different from the second slurry.

41. An apparatus for forming an interconnect on a workpiece, the workpiece having formed thereon a dielectric layer patterned to define the interconnect and a conductive layer formed over the dielectric layer, the apparatus comprising:

a platen having a polishing pad mounted thereon;

a dispenser operatively coupled to the polishing pad, the dispenser being configured to store a plurality of slurries and selectively dispense one or more of the stored slurries to the polishing pad;

a carrier configured to selectively hold the workpiece;

a conditioner selectively operatively coupled to the polishing pad; and a controller coupled to the platen, the dispenser, the conditioner and the carrier, the controller being configured to cause the apparatus to perform a first polish and a second polish of the workpiece, wherein:

in the first polish, the controller causes the carrier and platen to impart a polishing motion between the workpiece and the polishing pad according to a first set of polishing parameters, and also causes the dispenser to dispense a first slurry to an interface between the workpiece and the polishing pad;

the controller causes the dispenser to dispense water to the interface between the workpiece and the polishing pad after the first polish;

the controller causes the conditioner to condition the polishing pad after the first polish; and in the second polish, the controller causes the carrier and platen to impart a polishing motion between the workpiece and the polishing pad according to a second set of polishing parameters, and also causes the dispenser to dispense a second slurry to the interface between the workpiece and the polishing pad, the second slurry being different from the first slurry.

42. A method of performing chemical-mechanical polishing (CMP) of a wafer using a CMP machine, the CMP being performed on the wafer in a fabricating metal interconnects of an integrated circuit, the wafer having formed thereon a dielectric layer patterned to define an interconnect, a barrier layer formed on the dielectric layer and a metal layer formed on the barrier layer, the CMP machine having a platen with a polishing pad mounted thereon, a slurry dispenser and a wafer carrier, the method comprising:

disposing the wafer in an operative position to the polishing pad of the CMP machine using the wafer carrier;

performing a first polish of the wafer with a first slurry using the CMP machine configured with a first set of polishing parameters;

detecting a layer beneath the metal layer formed on the barrier layer;

stopping the first polish when the layer beneath the metal layer formed on the barrier layer has been detected; and performing a second polish of the wafer with a second slurry using the CMP machine configured with a second set of polishing parameters, wherein the second polish is performed using the polishing pad and platen that were used in the first polish, and wherein the second slurry is different from the first slurry.

* * * * *